US012618882B2

(12) United States Patent
Tanaka et al.

(10) Patent No.: US 12,618,882 B2
(45) Date of Patent: May 5, 2026

(54) COMMUNICATION APPARATUS, SMART METER, AND SECONDARY BATTERY

(71) Applicant: NGK INSULATORS, LTD., Nagoya (JP)

(72) Inventors: Ritsu Tanaka, Nagoya (JP); Iwao Ohwada, Nagoya (JP); Takaaki Koizumi, Tajimi (JP)

(73) Assignee: NGK INSULATORS, LTD., Nagoya (JP)

( * ) Notice: Subject to any disclaimer, the term of this patent is extended or adjusted under 35 U.S.C. 154(b) by 140 days.

(21) Appl. No.: 18/584,052

(22) Filed: Feb. 22, 2024

(65) Prior Publication Data

US 2024/0248122 A1 Jul. 25, 2024

Related U.S. Application Data

(63) Continuation of application No. PCT/JP2022/031739, filed on Aug. 23, 2022.

(30) Foreign Application Priority Data

Aug. 27, 2021 (JP) ................................. 2021-139082

(51) Int. Cl.
*G01R 22/06* (2006.01)
(52) U.S. Cl.
CPC ......... *G01R 22/063* (2013.01); *G01R 22/068* (2013.01)
(58) Field of Classification Search
CPC ........ H02J 7/00; H02J 7/02; H02J 7/04; H02J 7/06; H04B 1/38; H04B 1/40; G01R 22/06–068
See application file for complete search history.

(56) References Cited

U.S. PATENT DOCUMENTS

2004/0097270 A1* 5/2004 Cha ........................ H01Q 1/243
                                                    455/562.1
2006/0227523 A1 10/2006 Pennaz et al.
(Continued)

FOREIGN PATENT DOCUMENTS

CN          111384448 A      7/2020
JP      2008-539473 A     11/2008
(Continued)

OTHER PUBLICATIONS

International Search Report and Written Opinion (Application No. PCT/JP2022/031739) dated Nov. 8, 2022 (11 pages).
(Continued)

*Primary Examiner* — Huy Q Phan
*Assistant Examiner* — David B Frederiksen
(74) *Attorney, Agent, or Firm* — BURR PATENT LAW, PLLC

(57) ABSTRACT

A communication apparatus, which is mounted in a smart meter, includes: a secondary battery; a transmitter-receiver circuit that is operable by using electric power supplied from the secondary battery; and an antenna that emits a wireless signal based on a transmission signal, which is output from the transmitter-receiver circuit, to a space, wherein the secondary battery is a lithium-ion battery; and wherein when electric power supplied from outside to the smart meter is cut off, the transmitter-receiver circuit outputs the transmission signal indicating a specified alarm to the antenna by using the electric power supplied from the secondary battery and thereby wirelessly transmits the alarm via the antenna.

7 Claims, 3 Drawing Sheets

(56)     References Cited

U.S. PATENT DOCUMENTS

| | | | |
|---|---|---|---|
| 2009/0265123 A1* | 10/2009 | Porter | G01D 4/006 |
| | | | 702/187 |
| 2012/0025627 A1* | 2/2012 | Shionoiri | H04B 5/266 |
| | | | 307/104 |
| 2012/0313559 A1* | 12/2012 | Tonomura | H01M 50/20 |
| | | | 307/29 |
| 2013/0231063 A1* | 9/2013 | Nakatani | G01D 3/10 |
| | | | 455/70 |
| 2015/0189051 A1 | 7/2015 | Umehara et al. | |
| 2016/0070629 A1* | 3/2016 | Basile | G06F 11/3037 |
| | | | 235/375 |
| 2016/0235346 A1 | 8/2016 | Liu et al. | |
| 2017/0269131 A1 | 9/2017 | Yokota et al. | |
| 2017/0285715 A1 | 10/2017 | Tsuji | |
| 2020/0144860 A1* | 5/2020 | Lee | H01F 38/14 |
| 2020/0335768 A1 | 10/2020 | Yura et al. | |
| 2022/0155354 A1* | 5/2022 | Scoggins | G01R 22/068 |
| 2022/0360109 A1* | 11/2022 | Govindaraj | H02J 50/80 |

FOREIGN PATENT DOCUMENTS

| | | | | |
|---|---|---|---|---|
| JP | 2014-143817 | A | 8/2014 | |
| JP | 2015-144412 | A | 8/2015 | |
| JP | 2018-510672 | A | 4/2018 | |
| JP | 6383007 | B2 | 8/2018 | |
| JP | 6496435 | B1 | 4/2019 | |
| WO | WO-2004008721 | A1 * | 1/2004 | .......... H04B 1/3877 |
| WO | 2014/115209 | A1 | 7/2014 | |
| WO | 2016/098241 | A1 | 6/2016 | |
| WO | 2016/152307 | A1 | 9/2016 | |

OTHER PUBLICATIONS

English translation of the International Preliminary Report on Patentability (Chapter I) dated Mar. 7, 2024 (Application No. PCT/JP2022/031739).

Japanese Office Action (with English translation) dated Dec. 17, 2024 (Application No. 2023-543933).

* cited by examiner

COMMUNICATION APPARATUS, SMART METER, AND SECONDARY BATTERY

INCORPORATION BY REFERENCE

The contents of the following priority applications are herein incorporated by reference: Japanese Patent Application No. 2021-139082 filed on Aug. 27, 2021 and International Patent Application No. PCT/JP2022/031739 filed on Aug. 23, 2022.

BACKGROUND OF THE INVENTION

1. Field of the Invention

The present invention relates to a communication apparatus used by being mounted in a smart meter, the smart meter in which the communication apparatus is mounted, and a secondary battery mounted in the communication apparatus.

2. Description of Related Art

In recent years, along with a wide spread of distributed power sources which use renewable energy such as solar power generation, the development of next-generation smart meters is underway for the purpose of, for example, stabilization of demands and supplies for electric power and expansion of consumers' interests. One of desired functions of this next-generation smart meter is a Last Gasp function. The Last Gasp function is a function that detects a power outage upon its occurrence and immediately sends an alarm to a power distribution monitoring system.

A technology of PTL 1 (Japanese Patent No. 6383007) is known regarding implementation of the Last Gasp function of a smart meter. PTL 1 describes that a communication hub for measuring electric energy used by a smart meter system is equipped with an electric double layer capacitor (a supercapacitor) and the communication hub is made to perform a Last Gasp operation by using the electric power accumulated in the supercapacitor upon the occurrence of a power outage.

In PTL 1, a supercapacitor is mounted in order to supply the electric power during the power outage. However, generally with a capacitor including the supercapacitor, an output voltage and an output current change depending on discharge characteristics which are determined according to a time constant of the circuit, so that the supplied electric power fluctuates significantly due to the passing of time during electric discharge. Therefore, the supercapacitor needs to be enlarged in size in order to continue supply the electric power required for the Last Gasp operation for a certain amount of time or longer after the occurrence of the power outage, and there is fear that the size enlargement of the supercapacitor may squeeze a loading space for other equipment and circuits to be mounted in the smart meter and may also lead to the size enlargement of the smart meter.

In light of the above-described problem, it is an object of the present invention to provide a communication apparatus which can be mounted in a smart meter in a space-saving manner.

SUMMARY OF THE INVENTION

A communication apparatus according to the present invention, which is mounted in a smart meter, includes: a secondary battery; a transmitter-receiver circuit that is operable by using electric power supplied from the secondary battery; and an antenna that emits a wireless signal based on a transmission signal, which is output from the transmitter-receiver circuit, to a space, wherein the secondary battery is a lithium-ion battery; and wherein when electric power supplied from outside to the smart meter is cut off, the transmitter-receiver circuit outputs the transmission signal indicating a specified alarm to the antenna by using the electric power supplied from the secondary battery and thereby wirelessly transmits the alarm via the antenna. A smart meter according to the present invention is that in which the above communication apparatus is mounted. A secondary battery according to the present invention is to be mounted in the above communication apparatus.

According to the present invention, it is possible to provide the communication apparatus which can be mounted in the smart meter in the space-saving manner.

DESCRIPTION OF PREFERRED EMBODIMENTS

Figure 1:
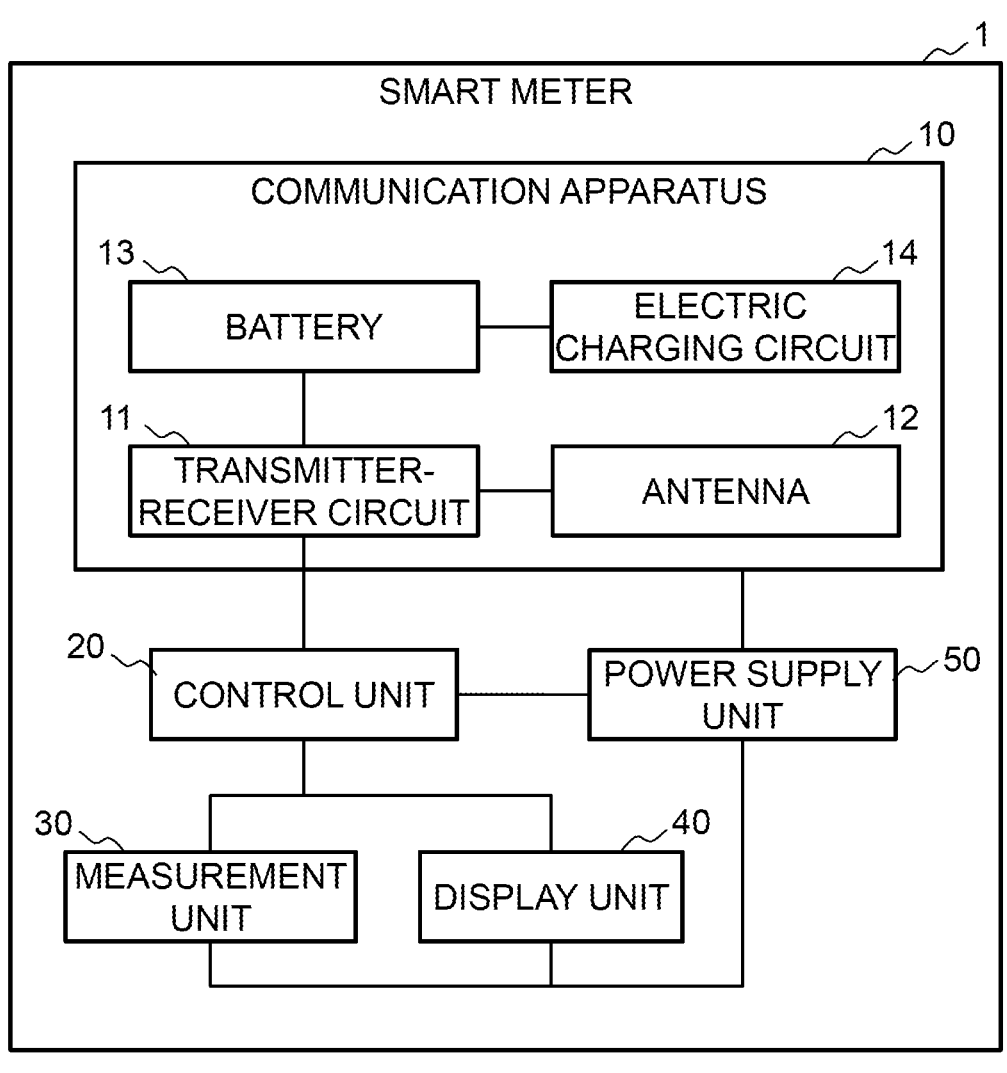
FIG. 1 is a schematic configuration diagram of a smart meter according to one embodiment of the present invention.

FIG. 1 is a schematic configuration diagram of a smart meter according to one embodiment of the present invention. A smart meter 1 illustrated in FIG. 1 is installed and used at, for example, a residence of a consumer who receives the supply of electric power from an electric power provider, such as an ordinary house or each room of a housing complex. The smart meter 1 has an electric power measurement function that measures the electric energy supplied to the consumer, and a communication function that transmits measurement results of the electric energy to the electric power provider.

The smart meter 1 is configured, as illustrated in FIG. 1, by including a communication apparatus 10, a control unit 20, a measurement unit 30, a display unit 40, and a power supply unit 50. The communication apparatus 10 includes a transmitter-receiver circuit 11, an antenna 12, a battery 13, and an electric charging circuit 14.

The control unit 20 controls the entire smart meter 1 by controlling operations of the communication apparatus 10, the measurement unit 30, the display unit 40 and the power supply unit 50, respectively. The control unit 20 is configured by using, for example, a microcomputer and implements its functions by executing a specified program(s). Incidentally, the control unit 20 may be configured by using, for example, a logical circuit such as an FPGA (Field Programmable Gate Array) instead of the microcomputer.

The measurement unit 30 measures the electric energy supplied to the consumer by detecting an electric current flowing through an electric power supply line to a residence where the smart meter 1 is installed. Examples of the electric power supply line regarding which the measurement unit 30 detects the electric current include, for example, a lead-in wire from an electricity distribution line to an ordinary house and wiring from the lead-in wire of a housing complex to each room. The measurement results of the electric energy by the measurement unit 30 are output to the control unit 20 and are then integrated.

Incidentally, the electric power can be generated on the consumer's side by means of, for example, solar power generation; and when the generated electric power is output via the electric power supply line to the electricity distribution line and is thereby sold to the electric power provider, that electric energy may be measured by the measurement unit 30. Also, the measurement results of the electric energy in this case are output from the measurement unit 30 to the control unit 20 and are then integrated.

The display unit 40 displays the electric energy measured by the measurement unit 30 and integrated by the control unit 20. The display unit 40 is configured by using, for example, a liquid crystal display or the like.

The power supply unit 50 generates a power source for causing each of the communication apparatus 10, the control unit 20, the measurement unit 30, and the display unit 40 to operate by using the electric power supplied from outside the smart meter 1 via the electric power supply line. The power supply unit 50 is configured by using, for example, an AC-DC converter and generates the power source by converting alternating-current power, which flows through the electric power supply line, to direct-current power of a specified voltage. The power source generated by the power supply unit 50 is supplied to each of the communication apparatus 10, the control unit 20, the measurement unit 30, and the display unit 40.

At the communication apparatus 10, the transmitter-receiver circuit 11 operates under control of the control unit 20 and performs wireless communication via the antenna 12. The transmitter-receiver circuit 11 generates a transmission signal by modulating, for example, data of the electric energy output from the control unit 20 and outputs the transmission signal to the antenna 12. The antenna 12 emits a wireless signal based on the transmission signal, which is output from the control unit 20, to a space. Consequently, the information of the electric energy measured by the measurement unit 30 and integrated by the control unit 20 is wirelessly transmitted from the smart meter 1 to the electric power provider. Also, various kinds of information wirelessly transmitted from the electric power provider can be received by the antenna 12 and demodulated by the transmitter-receiver circuit 11 and the obtained reception signal can be output to the control unit 20.

The battery 13 is configured by using, for example, a secondary battery such as a lithium-ion battery and supplies the electric power to the transmitter-receiver circuit 11 upon power loss. Since the supply of the electric power from the electricity distribution line to the consumer is cut off upon the occurrence of power outage, the supply of the power source from the power supply unit 50 to the communication apparatus 10 is stopped. When this happens, the transmitter-receiver circuit 11 operates by using the electric power supplied from the battery 13 and outputs a transmission signal indicating a specified alarm to the antenna 12. Consequently, it is possible to wirelessly transmit the alarm from the smart meter 1 via the antenna 12 to a monitoring system for monitoring a power distribution status and report the occurrence of the power outage. Such a function is called a Last Gasp function.

Furthermore, when the transmitter-receiver circuit 11 receives an alarm, which has been wirelessly transmitted from a communication apparatus mounted in another smart meter, via the antenna 12, it relays and transmits the alarm by retransmitting it via the antenna 12. Consequently, even if the other smart meter exists outside a communication range of the monitoring system and the alarm cannot be directly transmitted to the monitoring system, it becomes possible to report the occurrence of the power outage. Therefore, the Last Gasp function can be reliably implemented at a plurality of smart meters.

The electric charging circuit 14 charges the battery 13 by using the power source supplied from the power supply unit 50 to the communication apparatus 10. The electric charging circuit 14 is configured by using, for example, a voltmeter and a DC-DC converter; and if the voltage of the battery 13 becomes equal to or less than a specified reference value, the battery 13 is electrically charged by converting the direct-current power, which is supplied from the power supply unit 50, to the direct-current power of a specified voltage. Consequently, the electric charging circuit 14 can electrically charge the battery 13 by using the electric power suppled from outside to the smart meter 1.

Incidentally, the electric charging circuit 14 can electrically charge the battery 13 by means of, for example, constant voltage charging that makes the voltage applied to the battery 13 constant. Alternatively, the battery 13 may be electrically charged by means of constant electric current charging that makes the electric current of the battery 13 constant or the constant voltage charging and the constant electric current charging may be used concurrently. Besides the above, the battery 13 can be electrically charged by any arbitrary method.

Figure 2A:
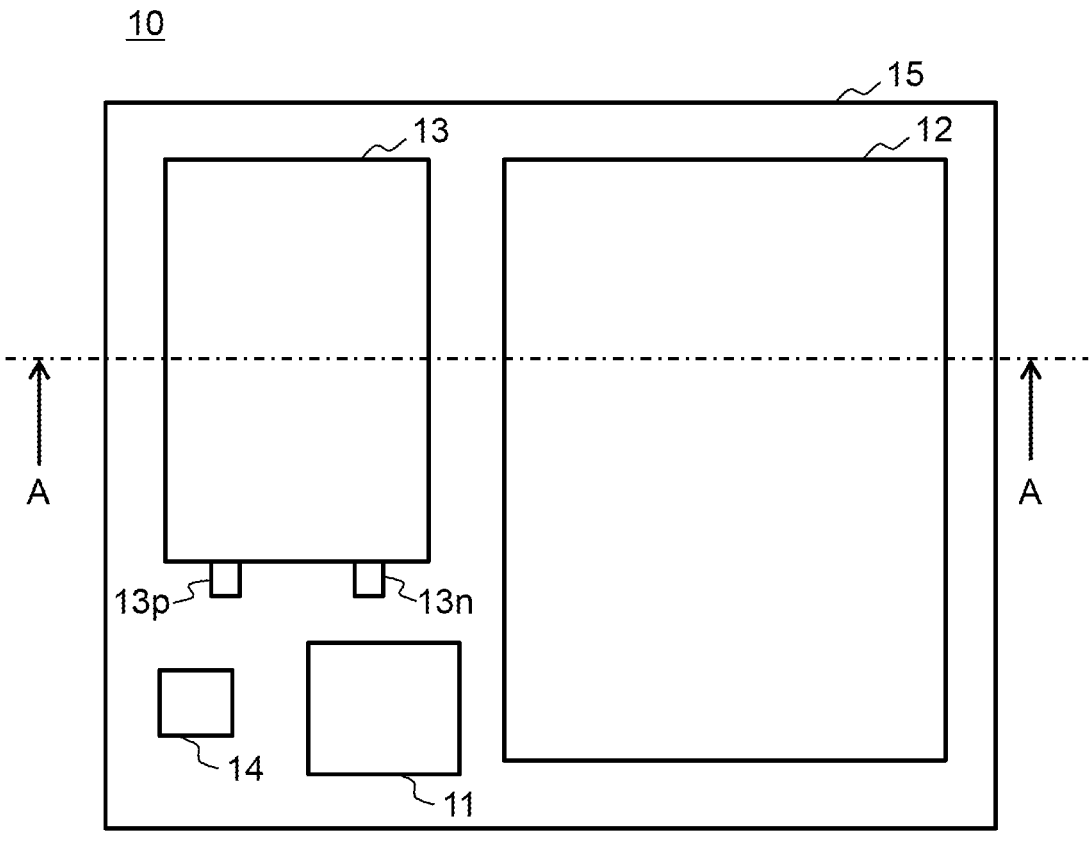
FIGS. 2A and 2B are diagrams illustrating one example of the structure of a communication apparatus mounted in the smart meter according to one embodiment of the present invention.
Figure 2B:
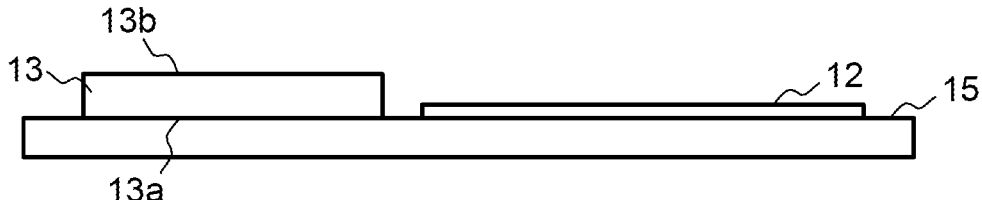

FIGS. 2A and 2B are diagrams illustrating one example of the structure of the communication apparatus 10 mounted in the smart meter according to one embodiment of the present invention. FIG. 2A is a plan view of the communication apparatus 10 and FIG. 2B is a sectional view of FIG. 2A taken along A-A.

The communication apparatus 10 further includes a circuit board 15 in addition to the transmitter-receiver circuit 11, the antenna 12, the battery 13, and the electric charging circuit 14 described earlier. With the communication apparatus 10, the respective components that are the transmitter-receiver circuit 11, the antenna 12, the battery 13, and the electric charging circuit 14 are mounted on the circuit board 15 in the arrangement illustrated in, for example, FIG. 2A and FIG. 2B. The antenna 12 is formed in a planar shape on the circuit board 15 and its shape and size are decided according to a frequency of wireless communication performed by the communication apparatus 10.

Incidentally, the component arrangement on the circuit board 15 as illustrated in FIG. 2A and FIG. 2B is just one example and other component arrangements may be employed. Furthermore, not all the transmitter-receiver circuit 11, the antenna 12, the battery 13, and the electric charging circuit 14 should necessarily be mounted on the circuit board 15 and any one of them may not be mounted on the circuit board 15. Furthermore, the circuit board 15 may be divided into two or more parts.

The battery 13 has a positive electrode terminal 13$p$ and a negative electrode terminal 13$n$. The positive electrode terminal 13$p$ and the negative electrode terminal 13$n$ of the battery 13 placed on the circuit board 15 are electrically connected respectively to a wiring pattern formed on the circuit board 15. Consequently, the battery 13 can perform electric discharge by applying a DC voltage and supplying the electric power to the transmitter-receiver circuit 11 via the wiring pattern of the circuit board 15. Moreover, it can perform electric charge by receiving the DC voltage which is applied from the electric charging circuit 14 via the wiring pattern of the circuit board 15.

The shape of a main body part of the battery 13 excluding the positive electrode terminal 13*p* and the negative electrode terminal 13*n* is a thin card shape and its thickness is, for example, 1 mm or less. Referring to FIG. 2B, when a back-side surface of the battery 13, that is, its surface in contact with the circuit board 15 is defined as a first principal plane 13*a* and its front-side surface, that is, its surface opposite the first principal plane 13*a* is defined as a second principal plane 13*b*, the battery 13 is placed so that the first principal plane 13*a* and the second principal plane 13*b* are respectively in parallel with the antenna 12. Consequently, it is possible to prevent the battery 13 from obstructing a wireless signal emitted from the antenna 12 and secure wireless communication performance required for the communication apparatus 10. Incidentally, the obstruction of the wireless signal emitted from the antenna 12 by the battery 13 may be avoided by providing a recess in the circuit board 15 to mount the battery 13 and burying a part or whole of the battery 13 in the recess. Alternatively, the battery 13 may be placed on the back-face side (the opposite side) of the circuit board 15 where the antenna 12 is mounted. In either case, the wireless communication performance can be secured without making the communication apparatus 10 thick because the battery 13 is thin with the thickness of 1 mm or less. In this example, a battery with the size of 38 mm (length)×27 mm (width)×0.5 mm (thickness) is used as the battery 13, but the battery 13 is not limited to this example. FIG. 2A and FIG. 2B show the example where one battery 13 is used; however, without limitation to this example, a plurality of batteries 13 may be mounted as necessary and, regarding a mounting method, the plurality of batteries 13 may be mounted on the front-face side of the circuit board 15 or may be mounted respectively on the front-face side and the back-face side of the circuit board 15.

Moreover, the battery 13 should preferably have specified bending resistance and torsion resistance. For example, the battery 13 can be configured to have the bending resistance and the torsion resistance that satisfy conditions specified in ISO/IEC 14443-1. Consequently, it is possible to enhance workability when assembling the communication apparatus 10, and enhance handleability of the battery 13.

The battery 13 having the characteristics explained above can be realized by, for example, a lithium-ion battery which uses a lithium composite oxide sintered body plate as a positive electrode plate. Such a lithium-ion battery is disclosed in, for example, Japanese Patent No. 6496435.

Now, an explanation will be provided about a comparison with a conventional smart meter. The conventional smart meter supplies the power source upon the occurrence of the power outage by using an electric double layer capacitor called a "supercapacitor" in order to implement the Last Gasp function. This supercapacitor is generally thicker than the battery 13 and thus has a problem of requiring a large loading space in its thickness direction. Furthermore, the supplied electric power varies considerably, as compared to the battery 13, due to the passage of time, so there is also a problem that it is difficult to continue stably supplying the electric power, which is required for operations of the transmitter-receiver circuit 11, for a certain amount of time or longer after the occurrence of the power outage.

Figure 3A:
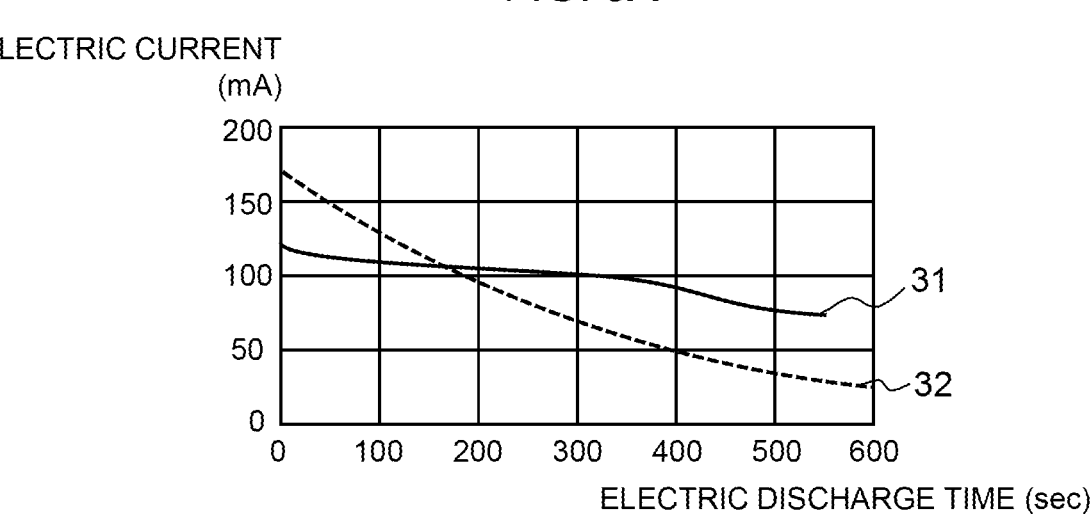
FIGS. 3A and 3B are diagrams illustrating examples of electric discharge characteristics of a battery and a supercapacitor.
Figure 3B:
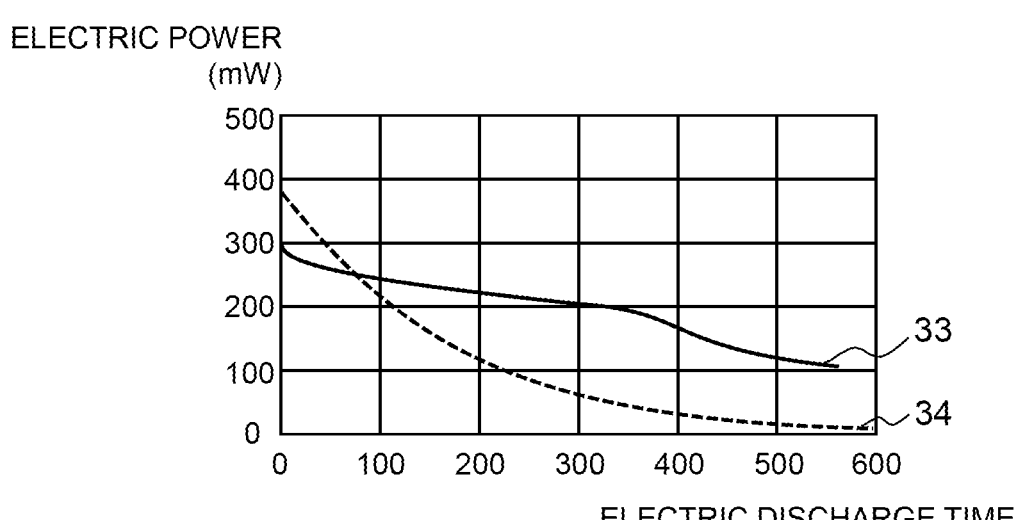

FIGS. 3A and 3B are diagrams illustrating examples of electric discharge characteristics of the battery 13 and the supercapacitor. In FIG. 3A, a graph 31 shows an example of the relationship between electric discharge time and an electric discharge current of the battery 13 and a graph 32 shows an example of the relationship between electric discharge time and an electric discharge current of the supercapacitor. Moreover, in FIG. 3B, a graph 33 shows an example of the relationship between the electric discharge time and electric discharge power of the battery 13 and a graph 34 shows an example of the relationship between the electric discharge time and electric discharge power of the supercapacitor. These graphs show changes of the electric current and the electric power over time, respectively, when the battery 13 whose nominal capacity is 24 mAh and the supercapacitor whose electrostatic capacity is 22 F are connected respectively to a specified electric discharge circuit and they are electrically discharged under specified electric discharge conditions.

When comparing the graph 31 and the graph 32 in FIG. 3A, you can see with the graph 31 which shows the electric discharge characteristics of the battery 13 that the electric discharge current gradually decreases over the passage of the electric discharge time, but its decrease width is relatively small. On the other hand, you can see with the graph 32 which shows the electric discharge characteristics of the supercapacitor that the electric discharge current decreases largely after the start of the electric discharge until the end of the electric discharge. Also, you can tell that the relationship similar to that between the graphs 31 and 32 in FIG. 3A is established between the graph 33 and the graph 34 in FIG. 3B.

Incidentally, the electric discharge characteristics of the supercapacitor as illustrated in the graphs 32 and 34 change according to a time constant of the electric discharge circuit including the supercapacitor, so that they are not necessarily constant. However, the tendency of the electric discharge current and the electric discharge power to decrease largely after the start of the electric discharge until the end of the electric discharge is the same even when the time constant of the electric discharge circuit is different.

The battery 13 has the characteristics that the decrease of the electric discharge current and the electric discharge power over the passing of time during the electric discharge is smaller than that of the supercapacitor as described above. With the smart meter 1 according to this embodiment, the communication apparatus 10 uses the battery 13, instead of the supercapacitor, as the electric power supply source to implement the Last Gasp function. Therefore, even if the loading space is small, it is possible to provide the communication apparatus 10 for the smart meter 1 which is capable of continuing stably supplying the electric power, which is required for the operations of the transmitter-receiver circuit 11 relating to the Last Gasp function, to the transmitter-receiver circuit 11 for a certain amount of time or longer after the occurrence of the power outage.

Incidentally, the above-mentioned embodiment has described the communication apparatus 10 as one of constituent elements within the smart meter 1, but the communication apparatus 10 may be distributed as a stand-alone communication apparatus in a state of being not mounted in the smart meter 1. A distribution form of the communication apparatus 10 does not matter as long as it can be mounted and used in the smart meter 1.

The following operational advantages are obtained according to the embodiment of the present invention described above.

(1) The communication apparatus 10 mounted in the smart meter 1 includes: the battery 13 that is a secondary battery; the transmitter-receiver circuit 11 that is operable by using electric power supplied from the battery 13; and the antenna 12 that emits a wireless signal based on a transmission signal, which is output from the transmitter-receiver circuit 11, to a space. When electric power supplied from outside to the smart meter 1 is cut off, the transmitter-receiver circuit 11 outputs the transmission signal indicating a specified alarm to the antenna 12 by using the electric power supplied from the battery 13 and thereby wirelessly transmits the alarm via the antenna 12. Consequently, it is possible to provide the communication apparatus 10 which can be mounted in the smart meter 1 in a space-saving manner.

(2) The battery 13 is, for example, a lithium-ion battery. Therefore, as compared to a case where a capacitor like a conventional supercapacitor is used, the battery 13 can continue supplying the required electric power stably even if it is of a small size.

(3) The communication apparatus 10 includes the circuit board 15 on which the transmitter-receiver circuit 11 and the antenna 12 are mounted. The battery 13 is placed on the circuit board 15 and the battery 13 has the first principal plane 13*a* in contact with the circuit board 15 and the second principal plane 13*b* opposite the first principal plane 13*a*. Consequently, the height-direction size of the communication apparatus 10 can be reduced, so that it is possible to realize the communication apparatus 10 which can be mounted in the smart meter 1 in a limited small loading space.

(4) The antenna 12 is formed in a planar shape on the circuit board 15. The battery 13 is placed so that the first principal plane 13*a* and the second principal plane 13*b* respectively become in parallel with the antenna 12. Consequently, the battery 13 is designed to not obstruct the wireless signal emitted from the antenna 12, so that it is possible to secure wireless communication performance required for the communication apparatus 10.

(5) The thickness of the battery 13 can be, for example, 1 mm or less. Consequently, the communication apparatus 10 including the battery 13 can be made thinner, so that it becomes possible to further enhance mountability.

(6) The battery 13 may have, for example, bending resistance and torsion resistance which satisfy conditions specified in ISO/IEC 14443-1. Consequently, it becomes possible to enhance workability when assembling the communication apparatus 10, and enhance handleability of the battery 13.

(7) The communication apparatus 10 includes the electric charging circuit 14 for electrically charging the battery 13 by using the electric power supplied from outside to the smart meter 1. Consequently, it is possible to maintain an optimum charged state of the battery 13 while operating the smart meter 1.

(8) The electric charging circuit 14 may electrically charge the battery 13 by means of the constant voltage charging. Consequently, charging control of the battery 13 can be simplified, so that it becomes possible to reduce the circuit scale and cost of the electric charging circuit 14.

(9) When the transmitter-receiver circuit 11 receives the alarm, which has been wirelessly transmitted from a communication apparatus mounted in another smart meter, via the antenna 12, the transmitter-receiver circuit 11 relays and transmits the alarm. Consequently, the Last Gasp function can be reliably implemented at a plurality of smart meters.

Incidentally, the present invention is not limited to the above-described embodiments and can be implemented by using arbitrary constituent elements within the scope that does not deviate from its gist.

The above-described embodiments and variations are merely examples and the present invention is not limited to the content of such embodiments and variations unless the features of the invention are impaired. Also, various embodiments and variations have been explained above, but the present invention is not limited to the content of such embodiments and variations. Other aspects which can be thought of within the scope of the technical idea of the present invention are also included within the scope of the present invention.

What is claimed is:

1. A communication apparatus mounted in a smart meter, comprising:
   a secondary battery;
   a transmitter-receiver circuit that is operable by using electric power supplied from the secondary battery; and
   an antenna that emits a wireless signal based on a transmission signal, which is output from the transmitter-receiver circuit, to a space,
   a circuit board on which the transmitter-receiver circuit, the battery and the antenna are mounted on a same side of the circuit board; and
   wherein the secondary battery is a lithium-ion battery having a thickness of 1 mm or less;
   wherein when electric power supplied from outside to the smart meter is cut off, the transmitter-receiver circuit outputs the transmission signal indicating a specified alarm to the antenna by using the electric power supplied from the secondary battery and thereby wirelessly transmits the alarm via the antenna;
   wherein the secondary battery has a first principal plane in contact with the circuit board and a second principal plane opposite the first principal plane:
   wherein the antenna is formed in a planar shape on the circuit board;
   wherein the secondary battery is placed so that the first principal plane and the second principal plane respectively become in parallel with the antenna; and
   wherein the secondary battery does not obstruct the wireless signal emitted from the antenna.

2. The communication apparatus according to claim 1, wherein the secondary battery has bending resistance and torsion resistance which satisfy conditions specified in ISO/IEC 14443-1.

3. The communication apparatus according to claim 1, comprising an electric charging circuit for electrically charging the secondary battery by using the electric power supplied from outside to the smart meter.

4. The communication apparatus according to claim 3, wherein the electric charging circuit electrically charges the secondary battery by means of constant voltage charging.

5. The communication apparatus according to claim 1, wherein when the transmitter-receiver circuit receives the alarm, which has been wirelessly transmitted from a communication apparatus mounted in another smart meter, via the antenna, the transmitter-receiver circuit relays and transmits the alarm.

6. The smart meter in which the communication apparatus according to claim 1 is mounted.

7. The secondary battery mounted in the communication apparatus according to claim 1.

* * * * *